Aug. 22, 1961 J. COHEN ET AL 2,996,798

METHOD OF BONDING MATERIALS

Filed July 17, 1958

JERROLD COHEN,
MANDEL WEINBERG,
INVENTORS.

BY

ATTORNEY.

2,996,798
Patented Aug. 22, 1961

2,996,798

METHOD OF BONDING MATERIALS

Jerrold Cohen and Mandel Weinberg, Los Angeles, Calif., assignors to Pacific Semiconductors, Inc., Culver City, Calif., a corporation of Delaware Filed July 17, 1958, Ser. No. 749,216
8 Claims. (Cl. 29—472.9)

This invention relates to the bonding of materials, and more particularly to a method of bonding metals to silicon.

When bonding materials together, it is usually desirable to have the contacting surfaces of the materials clean and free from impurities, undesired coatings, and corrosion. In some applications, even a slight degree of contamination of the contact surfaces drastically reduces the effectiveness of the bonded connection for the purposes intended. In such applications, even a brief exposure of the contacting surfaces to the ambient after the surfaces have been cleaned and before they are bonded together will frequently result in an undesired amount of contamination.

For example, in the semiconductor art, it is particularly desirable to provide a good electrical contact to the silicon surface of a semiconductor device. Usually, in the packaging of such a device, one end of a thin wire is bonded to the silicon surface and the other end of the wire welded to an electrical contact incorporated in the semiconductor package. Silicon has a strong affinity for oxygen and an oxide coating quickly forms on the surface of pure silicon exposed to air. If a metallic electrical conductor such as gold, platinum, or the like is "thermo-compression" bonded to an oxide coated surface of the silicon semiconductor body, both the electrical conductivity and the strength of the bonded joint will be much lower than they would have been had the bond been made to a clean oxide-free surface. The term thermo-compression bonding is used herein as discussed in an article entitled "Electrical Contact With Thermo-Compression Bonds" by H. Christensen, pages 127 to 130 of the April 1958 issue of Bell Laboratories Record. In practice, it has been found that even if the bonding operation is performed as soon as possible after the removal of oxides from the silicon surface the relatively short time of exposure to air before the bonding operation is completed is sufficient to allow formation of another oxide coating on the surface of the silicon, thereby causing a significant decrease in the average electrical conductivity of the resulting thermo-compression bonded joint. In addition, because of the relatively small area of contact between the wire and the silicon surface, the accompanying reduction in bond strength adversely affects the reliability of the semiconductor.

In order to obtain a strong thermo-compression bonded connection of the desired high electrical conductivity, it has heretofore been necessary to perform the bonding operation in an inert or reducing atmosphere of a forming gas. This prior art method is limited in its usefulness by the necessity of performing the bonding operation in an enclosure containing the forming gas atmosphere. In addition, the effectiveness of such a method is still dependent upon minimizing exposure of the silicon surfaces to air while transferring the semiconductor body from an oxide removal bath or apparatus to the forming gas enclosure.

Accordingly, it is an object of the present invention to provide a method of bonding materials together in the absence of undesired contamination in the area of contact between the materials.

It is a further object of the present invention to provide a convenient, rapid method of bonding materials together without exposing the contact area between the materials to the ambient.

It is a still further object of the present invention to provide a method of bonding materials together in which it is not necessary to minimize the time interval between the cleansing of the surfaces of the materials and the bonding operation.

It is yet another object of the present invention to provide a method of bonding metals to semiconductor materials which produces a strong bonded connection of high electrical conductivity.

Still another object of this invention is to provide a method for bonding a fine metal wire to the surface of a semiconductor crystal body.

Yet another object of the invention is to provide an improved method for bonding a fine gold wire to the surface of a silicon semiconductor crystal body.

In accordance with the method of the present invention, undesired contaminants are removed from the surfaces of the materials which are to be bonded together by covering the surfaces with cleansing substances impervious to the ambient. Maskant substances which are impervious to both the respective cleansing substances and the ambient are caused to displace the cleansing substances from the surfaces without exposure of the surfaces to the ambient, or are caused to cover the cleansing substances and prevent them from evaporating into the ambient. The surface or surfaces (either or both of which may be masked) are then placed in the desired position of contact with each other and sufficient heat and pressure are applied to the area of contact to cause the maskant substance and any cleansing substances to evaporate or flow from the area of contact and to bond together the two materials before the area of contact between them can become contaminated by exposure to the ambient.

Should only one of the materials be particularly subject to contamination by exposure to the ambient, then only that material need be cleansed and protectively masked. Of course, it is necessary to cleanse and mask only that portion of the surface to which the bonding contact is to be made.

The novel features which are believed to be characteristic of the present invention, together with further objects and advantages thereof, will be better understood from the following description and drawing in which the invention is illustrated by way of example. It is to be expressly understood, however, that this description and the drawing are for the purpose of illustration only, and that the true spirit and scope of the invention is defined by the accompanying claims.

Figure 5:
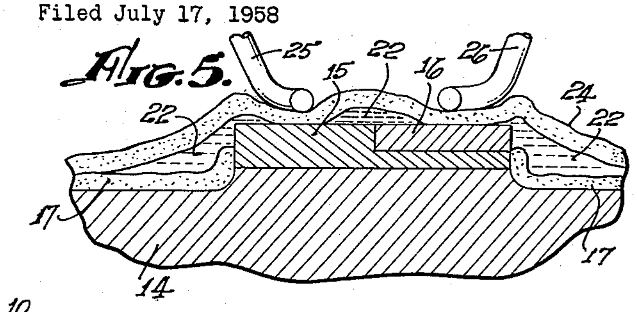
FIGURE 5 shows an enlarged cross-sectional view of the upper surface of a portion of the semiconductor device of the semiconductor assembly of FIGURE 4 upon removal from the cleansing bath and application of another protective wax coating.

For the purpose of illustration, the present invention will be discussed in connection with the bonding of fine gold leads to a silicon semiconductor crystal body in the absence of an oxide coating on the silicon surface. It will, of course, be understood that other wire or metal ribbons or the like, such as platinum, may also be used in accordance with the present invention. Further, if connection is to be made to a P-type conductivity area of a semiconductor crystal, an aluminum wire lead may be desirable. It should further be expressly understood, however, that the present invention is also equally applicable to the bonding of other materials where the absence of other types of undesired surface contamination is required.

Referring now to the drawing, there are shown in FIGURES 1 through 5 a series of cross-sectional views of a semiconductor assembly at succeeding stages of production, in accordance with the method of the present invention, as the surface of the semiconductor material is prepared for the bonding operation.

Figure 1:
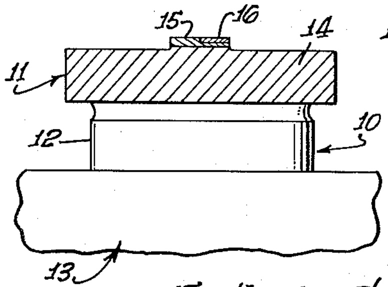
FIGURE 1 shows a cross-sectional view of a semiconductor assembly in a stage of production prior to attachment of the wire leads in accordance with the method of the present invention.

In FIGURE 1 there is shown a semiconductor assembly 10 consisting of a silicon semiconductor device 11 mounted on a molybdenum tab 12 which is in turn mounted on a gold plated metallic header 13. Semiconductor device 11 consists of a collector region 14, a base region 15, and an emitter region 16 (see FIGURE 5). Header 13 consists of a cylindrical body portion 30, through which extend insulating bushings 31, 32 and 33 (see FIGURES 4 and 7). Rigidly concentrically mounted within the insulating bushings 31, 32 and 33 are gold plated metallic terminal posts 34, 35 and 36, respectively, which protrude from both ends of the insulating bushings. At the stage of production shown in FIGURE 1, the semiconductor assembly 10 is ready for the fabrication of electrical connections to base region 15 and emitter region 16 of semiconductor device 11.

Figure 2:
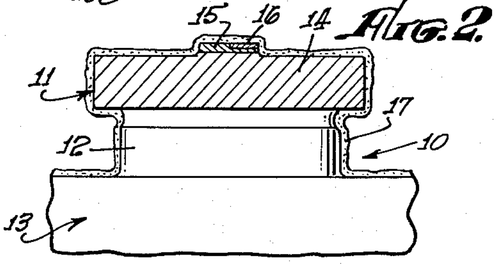
FIGURE 2 shows a cross-sectional view of the semiconductor assembly of FIGURE 1 upon application of a protective wax coating.

A protective coating 17 of a wax such as ceresin wax, which is impervious to hydrofluoric acid is disposed on the surfaces of the semiconductor assembly 10, resulting in an appearance shown in FIGURE 2.

Figure 3:
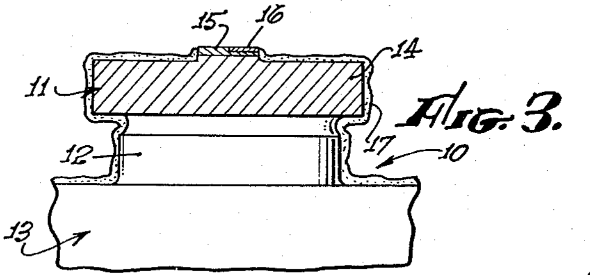
FIGURE 3 shows a cross-sectional view of the semiconductor assembly of FIGURE 2 upon removal of the wax coating from the upper surface of the semi-conductor material.

The wax coating 17 is removed from the upper surfaces of base region 15 and emitter region 16 of semiconductor device 11 by any method known to the art. For example, the surface may first be scraped with a pointed wood swab, then rubbed with another wood swab moistened with xylene, and finally blotted with a dry wood swab to absorb any excess xylene. After removal of the wax coating 17 from base region 15 and emitter region 16 of the semiconductor device 11, a cross-section of semiconductor assembly 10 will appear as shown in FIGURE 3.

Undesirable oxides are removed from the exposed surfaces by dipping semiconductor device 11 into a hydrofluoric acid solution, the ceresin wax coating 17 protecting the other surfaces from etching by the acid. It is to be understood that other oxide destroying acids may be employed for cleansing purposes in conjunction with a suitable substance, such as silicone oil (one example being DC–703 manufactured by the Dow Corning Company) or the like, for the protective coating 17, in lieu of hydrofluoric acid and the ceresin wax coating. The coating need be impervious to hydrofluoric acid and be soft enough to permit the hereinafter described steel strip to penetrate the same. After withdrawal from the hydrofluoric acid solution, semiconductor device 11 is then preferably rinsed with deionized water. To further assure removal of undesired surface contaminants semiconductor device 11 can be immersed in a weak acid solution, such as 1 part hydrofluoric acid, 5 parts nitric acid, and 200 parts acetic acid, and then rinsed in deionized water.

Figure 4:
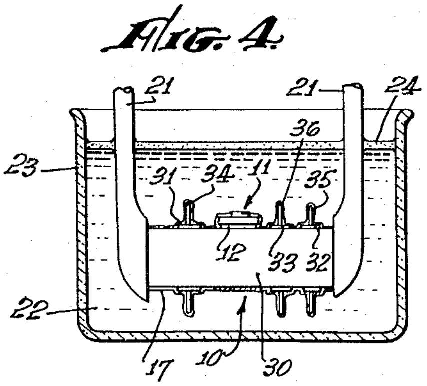
FIGURE 4 shows a cross-sectional view of the semiconductor assembly of FIGURE 3 upon immersion in a cleansing bath in accordance with the method of the present invention.

The next step in the presently preferred embodiment of the method of the present invention is shown in FIGURE 4. Semiconductor assembly 10 is grasped by tweezers 21 and immersed in a hydrofluoric acid solution 22, contained in polyethylene receptacle 23. A thin, continuous film 24 of ceresin wax is floated upon the surface of hydrofluoric acid 22 by depositing thereon with an eyedropper a heated solution of xylene and ceresin wax.

The semiconductor assembly 10 is then withdrawn from the hydrofluoric acid 22 up through the surface film 24 of ceresin wax, thereby causing a coating of ceresin wax to be deposited upon the entire upper surfaces of semiconductor device 11 before those surfaces can make contact with the ambient. An enlarged cross-sectional view of that portion of the upper surface of semiconductor device 11 containing base region 15, emitter region 16, and the immediately surrounding area of collector region 14 will then appear as shown in FIGURE 5. The minute spaces 22 between the newly deposited wax film 24 and the surfaces of semiconductor device 11 in the immediate vicinity of base region 15 and emitter region 16 are occupied by hydrofluoric acid 22 entrapped upon withdrawal of semiconductor assembly 10 from the polyethelyne receptacle 23. Thus, there has been no opportunity for the formation of oxides on the surfaces of base region 15 and emitter region 16 after cleansing of these surfaces by hydrofluoric acid. Semiconductor assembly 10 is then placed on a tantalum strip heater, not shown, with header 13 in contact with the heating surface. The ends of thin gold wire electrical leads 25 and 26 are placed in position upon the masked surfaces of base region 15 and emitter region 16, respectively, of the semiconductor device 11.

Figure 6:
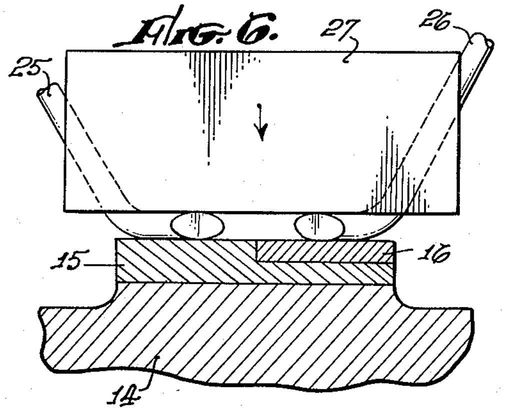
FIGURE 6 shows an enlarged cross-sectional view of the semiconductor device of FIGURE 5 upon attachment of the wire leads.

The electrical leads are held in contact with base region 15 and emitter region 16 by the lower edge of a thin steel strip 27 loaded by weights totaling approximately 800 grams. The thickness of steel strip 27 is on the order of 0.003 inch. The tantalum strip is quickly heated to a temperature of approximately 400° C., thereby causing the temperature in the area of contact between electrical lead 25 and base region 15 and between electrical lead 26 and emitter region 16 to rise to a temperature in the range from 200° C to 340° C. Upon nearing this temperature, the ceresin wax coatings 17 and 24, any hydrofluoric acid 22 entrapped between these coatings, and any remaining xylene will all volatilize at the same time the electrical leads 25 and 26 become bonded to the surfaces of semiconductor device 11 before the bonding contact areas can become oxidized by exposure to the ambient. After completion of the bonding operation, a cross-sectional view of the semiconductor device of FIGURE 5 will appear as shown in FIGURE 6.

Figure 7:
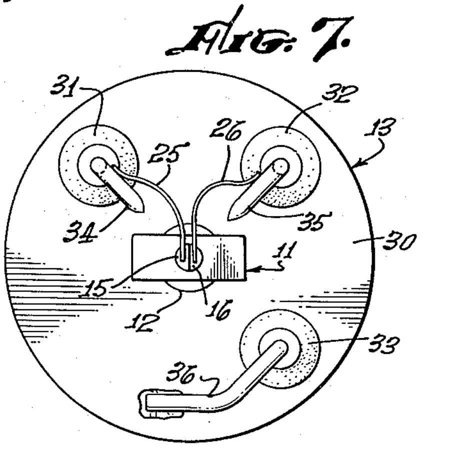
FIGURE 7 shows a plan view of the semiconductor assembly upon completion in accordance with the method of the present invention.

The free ends of electrical leads 25 and 26 are typically previously welded to terminal posts 34 and 35, respectively. The upper end of terminal post 36 is bent over and welded to the header 30. Thus, the completed semiconductor package will appear as shown in FIGURE 7, with base region 15 connected to terminal post 34 through electrical lead 25, emitter region 16 connected to terminal post 35 through electrical lead 26, and collector region 14 connected to terminal post 36 through molybdenum tab 12 and header 30.

Thus, there has been described a preferred embodiment of a method of bonding materials together in the absence of undesired contamination in the area of contact between the materials caused by exposure of the contact area to the ambient.

It will be understood that modifications and variations may be effected without departing from the novel concept of the invention as defined by the following claims.

What is claimed as new is:

1. The method of producing an oxide free bond between a semiconductor body and a metal electrode comprising the steps of: coating the semiconductor body with a relatively volatilizable, air-impervious coating; removing a portion of said coating in the bonding area in which said electrode is to be attached; cleaning the area thus exposed by covering the exposed area with an etchant capable of removing oxides from the exposed area; applying a relatively volatilizable air-impervious coating over the etchant-covered area without exposure of said area to the surrounding atmosphere; pressing said electrode to the thus coated bonding area; and heating the resulting assembly to a temperature sufficient to volatilize the coating and the entrapped etchant and to bond said electrode to the semiconductor body in the bonding area.

2. A method of bonding a metallic surface to a silicon surface comprising the steps of: covering the silicon surface with a concentrated hydrofluoric acid solution; coating the acid covered silicon surface with ceresin wax without exposure of the silicon surface to the ambient; placing the metallic surface in contact with said wax and hydrofluoric acid covered silicon surface; and heating the area of contact to a temperature sufficient to cause bonding of the metallic surface to the silicon surface.

3. A method of bonding a metallic electrical conductor to a silicon body comprising the steps of: immersing the silicon body in a concentrated hydrofluoric acid solution; depositing a continuous film of ceresin wax upon the surface of said hydrofluoric acid solution; withdrawing the silicon body from said hydrofluoric acid solution in such a manner that before the silicon body can contact the ambient a continuous film of ceresin wax will be deposited upon that portion of the silicon body surface to which the metallic electrical conductor is to be bonded; placing the metallic electrical conductor in contact with the wax covered silicon surface and heating the area of contact to a temperature in the range from 200° C. to 340° C.

4. The method of producing an oxide free bond between a semiconductor body and a metal electrode comprising the steps of: coating the semiconductor body with an air-impervious, acid etchant resistant, relatively volatilizable coating material; removing the coating thus produced in a predetermined bonding area to expose said bonding area; immersing the resulting assembly in an acid etchant solution capable of removing oxides from the bonding area; floating a layer of said coating material in liquid form over said solution; withdrawing said assembly from said solution and through said layer to thereby deposit a film of said coating material upon the etched bonding area; pressing said electrode into contact with the thus coated bonding area; and heating the entire assembly to a temperature sufficient to volatilize the coating material and entrapped acid etchant solution and to bond said electrode to said bonding area.

5. The method of producing an oxide free bond between a silicon semiconductor body and a metal electrode comprising the steps of: coating the silicon semiconductor body with an air-impervious, acid etchant resistant, relatively volatilizable coating material; removing the coating thus produced in a predetermined bonding area to expose said bonding area; immersing the resulting assembly in a hydrofluoric acid solution; floating a layer of said coating material in liquid form over said solution; withdrawing said assembly from said solution and through said layer to thereby deposit a film of said coating material upon the bonding area; placing said electrode into contact with the thus coated bonding area; and heating the entire assembly to a temperature sufficient to volatilize the coating material and entrapped acid solution and to bond said electrode to said bonding area.

6. The method of producing an oxide free bond between a silicon semiconductor body and a gold wire electrical lead comprising the steps of: coating the silicon semiconductor body with a ceresin wax; removing the wax over a predetermined bonding area to expose said bonding area; immersing the resulting assembly in an acid etchant solution capable of removing oxides from the bonding area; floating a layer of said wax in liquid form over said solution; withdrawing said assembly from said solution and through said wax layer to thereby deposit a film of said wax upon the bonding area; placing said lead into contact with the thus coated bonding area; and heating the entire assembly to a temperature in the range from 200° C. to 340° C.

7. The method of producing an oxide free bond between a silicon semiconductor body and a gold wire electrical lead comprising the steps of: coating the silicon semiconductor body with a ceresin wax coating; removing a portion of said coating in the bonding area in which said lead is to be attached; cleaning the area thus exposed with hydrofluoric acid; applying a ceresin wax coating over the hydrofluoric acid covered area without exposure of said area to the surrounding atmosphere; placing said electrical lead to the thus coated bonding area; and heating the resulting assembly to a temperature sufficient to volatilize the coating and entrapped hydrofluoric acid and to bond said electrical lead to the silicon semiconductor body in the bonding area.

8. A method of bonding a gold wire electrical lead to a silicon semiconductor body comprising the steps of: immersing the silicon semiconductor body in a concentrated hydrofluoric acid solution; depositing a continuous film of ceresin wax upon the surface of said hydrofluoric acid solution; withdrawing the silicon semiconductor body from said hydrofluoric acid solution in such a manner that before the silicon semiconductor body can contact the ambient a continuous film of ceresin wax will be deposited upon that portion of the semiconductor body surface to which the gold wire electrical leads are to be bonded; placing the gold wire electrical lead in contact with the wax covered semiconductor body surface and heating the area of contact to a temperature in the range from 200° C. to 340° C.

References Cited in the file of this patent

UNITED STATES PATENTS

| | | |
|---|---|---|
| 1,726,100 | Da Costa | Aug. 27, 1929 |
| 2,092,191 | Thomas | Sept. 7, 1937 |
| 2,629,800 | Pearson | Feb. 24, 1953 |
| 2,654,059 | Shockley | Sept. 29, 1953 |
| 2,671,264 | Pessel | Mar. 9, 1954 |
| 2,807,561 | Nelson | Sept. 24, 1957 |
| 2,856,681 | Lacy | Oct. 21, 1958 |
| 2,907,104 | Brown | Oct. 6, 1959 |

OTHER REFERENCES

R.C.A. Technical Notes No. 8, published by Radio Corporation of America, R.C.A. Laboratories, Princeton, N.J. (Copy Received in Patent Office Library on Aug. 9, 1957.)